United States Patent
Chien et al.

(10) Patent No.: US 10,389,515 B1
(45) Date of Patent: Aug. 20, 2019

(54) INTEGRATED CIRCUIT, MULTI-CHANNEL TRANSMISSION APPARATUS AND SIGNAL TRANSMISSION METHOD THEREOF

(71) Applicants: Global Unichip Corporation, Hsinchu (TW); Taiwan Semiconductor Manufacturing Co., Ltd., Hsinchu (TW)

(72) Inventors: Ting-Hsu Chien, Hsinchu (TW); Chih-Wen Cheng, Hsinchu (TW); Hua-Shih Liao, Hsinchu (TW)

(73) Assignees: Global Unichip Corporation, Hsinchu (TW); Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/184,944

(22) Filed: Nov. 8, 2018

(30) Foreign Application Priority Data

Jul. 16, 2018 (TW) .............................. 107124463 A

(51) Int. Cl.
*H04L 7/04* (2006.01)
*H04L 7/00* (2006.01)
*H03L 7/08* (2006.01)
*H03K 21/38* (2006.01)
*H03K 5/135* (2006.01)

(52) U.S. Cl.
CPC ........... *H04L 7/0091* (2013.01); *H03K 5/135* (2013.01); *H03K 21/38* (2013.01); *H03L 7/08* (2013.01)

(58) Field of Classification Search
CPC . H04L 7/0091; H04L 25/14; H04L 2007/045; H04L 2007/047; H03K 5/135; H03K 21/38; H03L 7/08; H01L 2027/11877
USPC .................................................. 375/354–376
See application file for complete search history.

(56) References Cited

U.S. PATENT DOCUMENTS 4,710,871 A * 12/1987 Belknap ................ H04L 1/1671
370/463
6,115,422 A * 9/2000 Anderson .......... H04N 21/4341
370/392

(Continued)

OTHER PUBLICATIONS

"Office Action of Taiwan Counterpart Application," dated Dec. 22, 2018, p. 1-p. 4.

*Primary Examiner* — James M Perez
(74) *Attorney, Agent, or Firm* — JCIPRNET

(57) ABSTRACT

An integrated circuit, a multi-channel transmission apparatus, and a signal transmission method thereof are provided. The multi-channel transmission apparatus includes a pre-stage circuit, a clock signal generator, and a post-stage circuit. The pre-stage circuit receives a plurality of first clock signals and a plurality of data signals, selects one of the first clock signals to be a base clock signal, and transmits the data signals according to the base clock signal to respectively generate a plurality of middle signals. The clock signal generator generates the first clock signals according to a second clock signal, wherein a frequency of the second clock signal is higher than a frequency of the first clock signals. The post-stage circuit transmits the middle signals according to the second clock signal to respectively generate a plurality of output signals. The pre-stage circuit is a digital circuit, and the post-stage circuit is an analog circuit.

21 Claims, 4 Drawing Sheets

(56) References Cited

U.S. PATENT DOCUMENTS

| | | | |
|---|---|---|---|
| 6,288,656 B1* | 9/2001 | Desai | H04L 7/041 341/100 |
| 6,327,259 B1* | 12/2001 | Chiu | G06F 13/372 370/375 |
| 6,509,773 B2* | 1/2003 | Buchwald | H03L 7/0814 327/248 |
| 6,522,829 B1* | 2/2003 | Muramatsu | G11B 27/034 386/283 |
| 6,693,918 B1* | 2/2004 | Dallabetta | G06F 5/065 370/366 |
| 6,847,655 B2* | 1/2005 | Colombo | H04J 3/0608 370/474 |
| 7,295,644 B1* | 11/2007 | Wu | H03L 7/0807 375/375 |
| 7,454,537 B1* | 11/2008 | Xue | G06F 5/06 710/52 |
| 7,558,357 B1* | 7/2009 | Greshishchev | H04L 7/0337 327/114 |
| 7,599,456 B1* | 10/2009 | Chi | H03F 3/217 370/232 |
| 7,606,341 B2* | 10/2009 | Pereira | H04L 7/0337 375/224 |
| 7,634,694 B2* | 12/2009 | Green | H04L 25/03866 327/307 |
| 7,822,111 B2* | 10/2010 | Sohn | H04L 25/03038 375/231 |
| 8,050,373 B2* | 11/2011 | Buchwald | H04L 25/20 327/147 |
| 8,064,535 B2* | 11/2011 | Wiley | H04L 5/20 375/288 |
| 8,116,415 B2* | 2/2012 | Wada | H03K 5/135 375/260 |
| 8,385,374 B1* | 2/2013 | Wohlgemuth | H04L 25/14 370/464 |
| 8,473,638 B2* | 6/2013 | Aweya | H04J 3/0667 709/203 |
| 8,838,999 B1* | 9/2014 | Sathe | H04L 63/0428 713/190 |
| 9,276,592 B2* | 3/2016 | Lin | H03L 7/085 |
| 9,300,461 B2* | 3/2016 | Akita | H03L 7/087 |
| 9,329,623 B2* | 5/2016 | Vankayala | G06F 1/12 |
| 9,337,934 B1* | 5/2016 | Agazzi | H04B 10/40 |
| 9,432,176 B2* | 8/2016 | Yu | H04L 7/0025 |
| 9,432,298 B1* | 8/2016 | Smith | H04L 49/9057 |
| 9,474,034 B1* | 10/2016 | Baumgartner | H04W 56/001 |
| 9,503,250 B2* | 11/2016 | Van Rens | H04L 7/02 |
| 9,559,880 B1* | 1/2017 | Cirit | H04L 25/08 |
| 9,565,036 B2* | 2/2017 | Zerbe | H04L 25/0264 |
| 9,614,500 B2* | 4/2017 | Zhang | H03K 3/0375 |
| 9,647,781 B2* | 5/2017 | Miyaji | H04L 25/14 |
| 9,680,666 B2* | 6/2017 | Wiley | H04L 5/20 |
| 9,742,549 B1* | 8/2017 | Wang | H04J 3/0647 |
| 10,033,413 B2* | 7/2018 | Pratt | H04B 1/0475 |
| 10,038,450 B1* | 7/2018 | Cory | G06F 5/06 |
| 10,090,883 B2* | 10/2018 | Kuo | H04B 3/50 |
| 10,104,148 B2* | 10/2018 | Yang | H04L 65/608 |
| 10,205,586 B2* | 2/2019 | Paul | H04L 7/0331 |
| 10,284,400 B2* | 5/2019 | Tanio | H04L 27/12 |
| 2001/0001616 A1* | 5/2001 | Rakib | H03M 13/256 375/259 |
| 2003/0007581 A1* | 1/2003 | Agazzi | G01R 31/3004 375/341 |
| 2004/0052319 A1* | 3/2004 | Wakamatsu | H04L 27/2656 375/343 |
| 2004/0184573 A1* | 9/2004 | Andersen | H03H 17/0621 375/372 |
| 2005/0238126 A1* | 10/2005 | Ribo | H03L 7/0814 375/355 |
| 2006/0050827 A1* | 3/2006 | Saeki | H03M 9/00 375/362 |
| 2007/0033337 A1* | 2/2007 | Butt | G11C 7/1051 711/105 |
| 2007/0033466 A1* | 2/2007 | Buchmann | G06F 13/4291 714/731 |
| 2007/0071003 A1* | 3/2007 | Landolt | H04L 7/08 370/389 |
| 2008/0174347 A1* | 7/2008 | Oshima | G06F 1/12 327/145 |
| 2008/0226004 A1* | 9/2008 | Oh | G06F 1/10 375/358 |
| 2009/0240969 A1* | 9/2009 | Chiu | G06F 13/4278 713/401 |
| 2010/0254198 A1* | 10/2010 | Bringivijayaraghavan | G11C 7/1078 365/189.05 |
| 2010/0283525 A1* | 11/2010 | Yoshikawa | H03K 3/84 327/237 |
| 2010/0327923 A1* | 12/2010 | Pyeon | G06F 1/08 327/145 |
| 2011/0208990 A1* | 8/2011 | Zerbe | G06F 1/08 713/501 |
| 2011/0228888 A1* | 9/2011 | Gelter | H04L 49/90 375/371 |
| 2013/0034197 A1* | 2/2013 | Aweya | H04J 3/0664 375/362 |
| 2013/0249612 A1* | 9/2013 | Zerbe | H04L 7/0079 327/161 |
| 2013/0249719 A1* | 9/2013 | Ryan | G06F 5/06 341/118 |
| 2014/0044137 A1* | 2/2014 | Miyaji | H04L 25/14 370/509 |
| 2014/0055184 A1* | 2/2014 | Vankayala | G06F 1/12 327/161 |
| 2014/0229785 A1* | 8/2014 | Barakat | H04L 1/12 714/746 |
| 2016/0365969 A1* | 12/2016 | Ministeru | H04L 1/0045 |
| 2017/0310310 A1* | 10/2017 | Kargl | H03K 3/66 |
| 2018/0026779 A1* | 1/2018 | Bunce | H04L 7/0008 375/355 |
| 2018/0069732 A1* | 3/2018 | Sugawara | H04J 3/06 |
| 2018/0102863 A1* | 4/2018 | Royle | H04J 3/0667 |
| 2018/0145822 A1* | 5/2018 | Takahashi | H04L 7/00 |
| 2018/0191802 A1* | 7/2018 | Yang | H04L 65/608 |
| 2019/0028574 A1* | 1/2019 | Sun | H04L 69/18 |

* cited by examiner

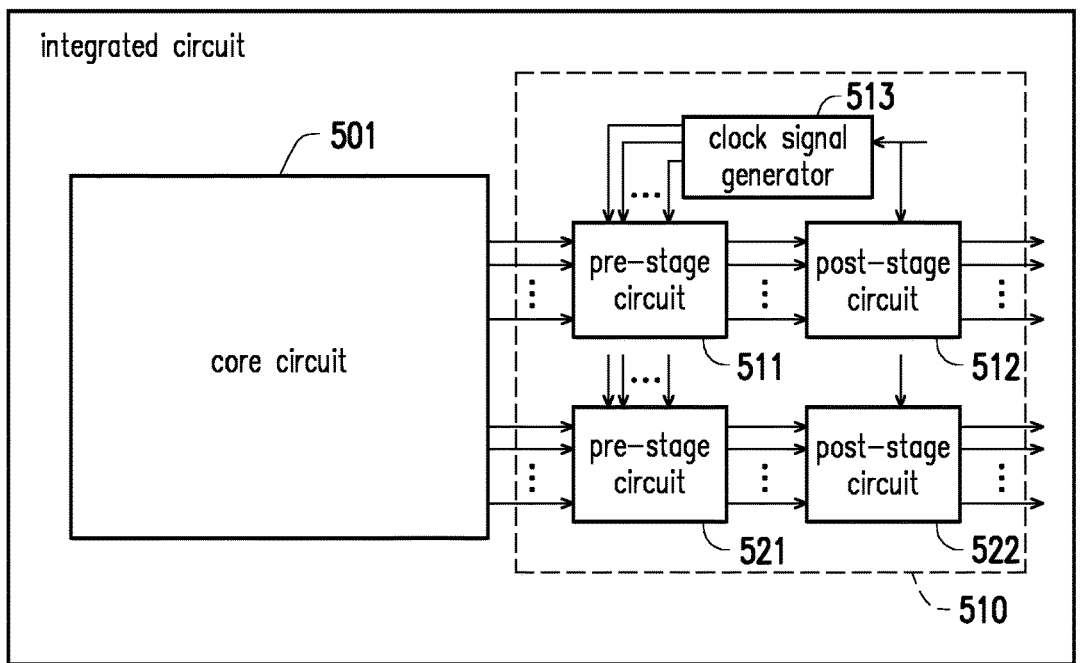

FIG. 5

| Providing a pre-stage circuit to receive a plurality of first clock signals and a plurality of data signals, select one of the first clock signals to be a base clock signal, and transmit the data signals according to the base clock signal to respectively generate a plurality of middle signals | S610 |

| Providing a clock signal generator to generate the first clock signals according to a second clock signal, wherein a frequency of the second clock signal is higher than a frequency of the first clock signals | S620 |

| Providing a post-stage circuit to transmit the middle signals according to the second clock signal to respectively generate a plurality of output signals | S630 |

| Providing the pre-stage circuit to receive a flag signal and synchronize the flag signal according to the base clock signal to generate a first synchronization flag signal, wherein the pre-stage circuit combines the first synchronization flag signal into each of the middle signals and transmits them to the post-stage circuit | S640 |

FIG. 6

INTEGRATED CIRCUIT, MULTI-CHANNEL TRANSMISSION APPARATUS AND SIGNAL TRANSMISSION METHOD THEREOF

CROSS-REFERENCE TO RELATED APPLICATION

This application claims the priority benefit of Taiwan application serial no. 107124463, filed on Jul. 16, 2018. The entirety of the above-mentioned patent application is hereby incorporated by reference herein and made a part of this specification.

BACKGROUND OF THE INVENTION

Field of the Invention

The disclosure relates to an integrated circuit, a multi-channel transmission apparatus, and a signal transmission method thereof, and in particular, to an integrated circuit, a multi-channel transmission apparatus, and a signal transmission method thereof that reduce data transmission skew.

Description of Related Art

With the great improvement of electronic technology, electronic devices have become important tools in our daily life. The integrated circuit in the electronic device is generally configured with a multi-channel transmission apparatus to provide high-bandwidth data transmission capacity.

However, in the multi-channel transmission apparatus, data transmission skew generally occurs and causes data transmission delay. The data transmission skew may result from wiring differences in clock signal transmission lines between multiple channels, phase differences in analog circuits and high-speed (serial) clock signals and low-speed (parallel) clock signals after frequency division between multiple channels, and clock domain crossing (CDC), among other factors.

Particularly, when the metastable state occurs, the data transmission skew generated in the multi-channel transmission apparatus may be increased and cause more serious data transmission delay.

SUMMARY OF THE INVENTION

The disclosure provides an integrated circuit, a multi-channel transmission apparatus, and a signal transmission method thereof that can effectively reduce transmission delay generated in data transmission.

The multi-channel transmission apparatus of the disclosure includes a pre-stage circuit, a clock signal generator, and a post-stage circuit. The pre-stage circuit receives a plurality of first clock signals and a plurality of data signals, selects one of the first clock signals to be a base clock signal, and transmits the data signals according to the base clock signal to respectively generate a plurality of middle signals. The clock signal generator receives a second clock signal and generates the first clock signals according to the second clock signal, wherein a frequency of the second clock signal is higher than a frequency of the first clock signals. The post-stage circuit is coupled to the pre-stage circuit and the clock signal generator and transmits the middle signals according to the second clock signal to respectively generate a plurality of output signals. The pre-stage circuit includes a parallel flag signal synchronization circuit. The parallel flag signal synchronization circuit receives a flag signal and synchronizes the flag signal according to the base clock signal to generate a first synchronization flag signal, wherein the pre-stage circuit combines the first synchronization flag signal into each of the middle signals and transmits the combined signals to the post-stage circuit. The pre-stage circuit is a digital circuit, and the post-stage circuit is an analog circuit.

The integrated circuit of the disclosure includes a multi-channel transmission apparatus. The multi-channel transmission apparatus includes the clock signal generator described above, at least one pre-stage circuit described above, and at least one post-stage circuit described above.

The multi-channel signal transmission method of the disclosure includes the following steps. A pre-stage circuit is provided to receive a plurality of first clock signals and a plurality of data signals, select one of the first clock signals to be a base clock signal, and transmit the data signals according to the base clock signal to respectively generate a plurality of middle signals. A clock signal generator is provided to generate the first clock signals according to a second clock signal, wherein a frequency of the second clock signal is higher than a frequency of the first clock signals. A post-stage circuit is provided to transmit the middle signals according to the second clock signal to respectively generate a plurality of output signals. The pre-stage circuit is made to receive a flag signal and synchronize the flag signal according to the base clock signal to generate a first synchronization flag signal, wherein the pre-stage circuit combines the first synchronization flag signal into each of the middle signals and transmits the combined signals to the post-stage circuit. The pre-stage circuit is a digital circuit, and the post-stage circuit is an analog circuit.

Based on the above, in the disclosure, the multi-channel transmission apparatus is divided into the pre-stage circuit, which is a digital circuit, and the post-stage circuit, which is an analog circuit. Moreover, the post-stage circuit, which is an analog circuit, is used to perform data transmission operations based on the second clock signal having a relatively high frequency. Accordingly, even if the metastable state occurs, the generated data transmission skew can be effectively reduced, and the data transmission rate can be enhanced.

To provide a further understanding of the aforementioned and other features and advantages of the disclosure, exemplary embodiments, together with the reference drawings, are described in detail below.

BRIEF DESCRIPTION OF THE DRAWINGS

FIG. 5 is a schematic diagram illustrating an integrated circuit according to an embodiment of the disclosure.

FIG. 6 is a flowchart illustrating a multi-channel signal transmission method according to an embodiment of the disclosure.

DESCRIPTION OF THE EMBODIMENTS

Figure 1:
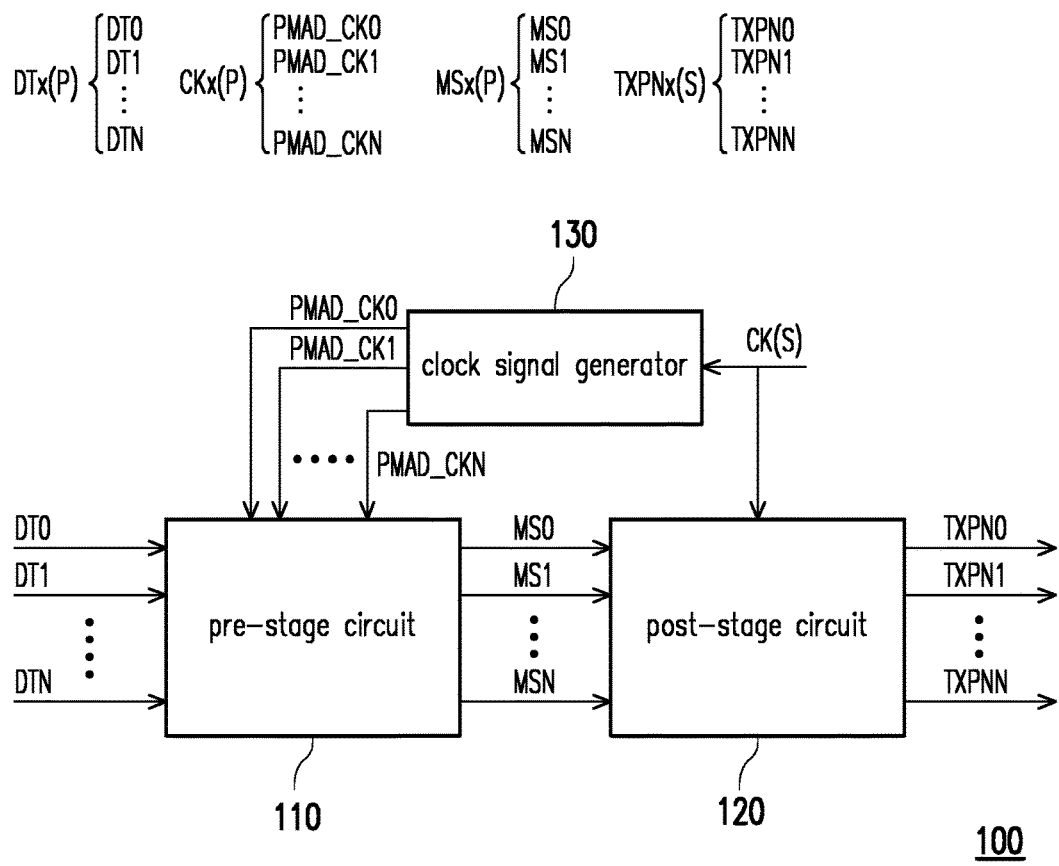
FIG. 1 is a schematic diagram illustrating a multi-channel transmission apparatus according to an embodiment of the disclosure.

Referring to FIG. 1, FIG. 1 is a schematic diagram illustrating a multi-channel transmission apparatus according to an embodiment of the disclosure. A multi-channel transmission apparatus 100 includes a pre-stage circuit 110, a post-stage circuit 120, and a clock signal generator 130. The pre-stage circuit 110 is coupled to the clock signal generator 130. The pre-stage circuit 110 receives a multi-channel clock CKx(p) and a multi-channel data DTx(p). The multi-channel clock CKx(p) includes a plurality of first clock signals PMAD_CK0 to PMAD_CKN, and the multi-channel data DTx(p) includes a plurality of parallel data signals DT0 to DTN. The pre-stage circuit 110 selects one of the first clock signals PMAD_CK0 to PMAD_CKN of the multi-channel clock CKx(p) to be a base clock signal. The pre-stage circuit 110 is configured to receive the multi-channel data DTx(p) and output a multi-channel middle signal MSx(p) according to the base clock signal. The multi-channel middle signal MSx(p) includes a plurality of parallel middle signals MS0 to MSN.

The post-stage circuit 120 is coupled to the pre-stage circuit 110 and the clock signal generator 130. The post-stage circuit 120 is configured to receive the multi-channel middle signal MSx(p) and output a multi-channel output signal TXPNx(s) according to a second clock signal CK(s). The multi-channel output signal TXPNx(s) includes a plurality of serial output signals TXPN0 to TXPNN. The clock signal generator 130 is configured to receive the second clock signal CK(s) and generate the multi-channel clock CKx(p) according to the second clock signal CK(s). The frequency of the multi-channel clock CKx(p) is all lower than the frequency of the second clock signal CK(s).

In the embodiment, the clock signal generator 130 performs a frequency division operation on the second clock signal CK(s) according to a plurality of different divisors to generate the multi-channel clock CKx(p). Specifically, the multi-channel clock CKx(p) includes the plurality of first clock signals PMAD_CK0 to PMAD_CKN having the same frequency and different phases. The divisor may be any real number larger than 1 and is not specifically limited herein.

It is noted that, in the embodiment, the pre-stage circuit 110 is a digital circuit, and the post-stage circuit 120 is an analog circuit. Moreover, the pre-stage circuit 110 selects one of the first clock signals PMAD_CK0 to PMAD_CKN of the multi-channel clock CKx(p) to be the base clock signal and performs transmission operations of the multi-channel data DTx(p) according to the base clock signal having a relatively low frequency. Since the pre-stage circuit 110 is a digital circuit, the data skew state generated in the pre-stage circuit 110 can be controlled through static timing analysis (STA) techniques.

On the other hand, in the post-stage circuit 120, transmission operations of the multi-channel middle signal MSx(p) are performed according to the second clock signal CK(s) having a relatively high frequency. Accordingly, the post-stage circuit 120 in the form of an analog circuit can be designed based on one single clock signal, which reduces design complexity resulting from the design for overcoming the data skew state. Moreover, by performing data transmission operations based on the second clock signal CK(s) having a relatively high frequency, even if the metastable state occurs, the generated data skew can be reduced to the lowest.

Figure 2:
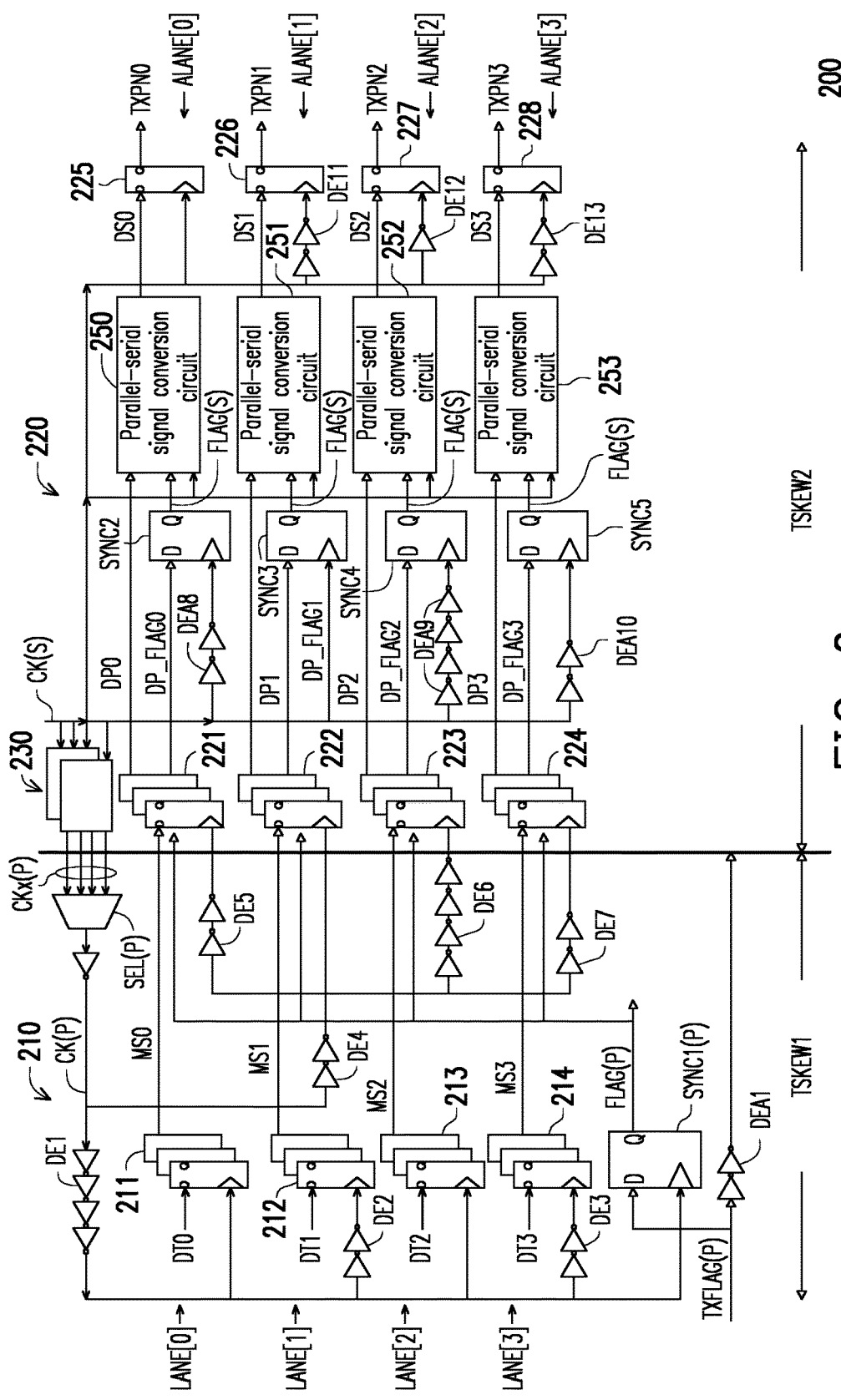
FIG. 2 is a circuit schematic diagram illustrating a multi-channel transmission apparatus according to another embodiment of the disclosure.

Next, referring to FIG. 2, FIG. 2 is a circuit schematic diagram illustrating a multi-channel transmission apparatus according to another embodiment of the disclosure. A multi-channel transmission apparatus 200 includes a pre-stage circuit 210, a post-stage circuit 220, and a clock signal generator 230. The pre-stage circuit 210 includes a plurality of digital transmission channels LANE[0] to LANE[3], a parallel flag signal synchronization circuit SYNC1(p), and a selector SEL(p). The digital transmission channels LANE[0] to LANE[3] respectively receive parallel data signals DT0 to DT3. Each of the data signals DT0 to DT3 is a parallel signal having a plurality of bits. The selector SEL(p) receives a multi-channel clock CKx(p) generated by the clock signal generator 230 and selects one of clock signals of the multi-channel clock CKx(p) to generate a base clock signal CK(p).

The digital transmission channels LANE[0] to LANE[3] respectively include flip-flop sets 211 to 214. The input terminals of the flip-flop sets 211 to 214 respectively receive the data signals DT0 to DT3. Suitable transmission delay circuits DE1 to DE3 may be disposed (or not disposed) between the clock terminals of the flip-flop sets 211 to 214 and the selector SEL(p), so that the time points at which trigger operations occur in the flip-flop sets 211 to 214 according to the base clock signal CK(p) can be substantially identical.

The flip-flop sets 211 to 214 perform data transmission operations of the data signals DT0 to DT3 according to the base clock signal CK(p) and respectively generate parallel middle signals MS0 to MS3 at the output terminals of the flip-flop sets 211 to 214.

On the other hand, the parallel flag signal synchronization circuit SYNC1(p) receives a flag signal TXFLAG(p) and performs a synchronization operation of the flag signal TXFLAG(p) according to the base clock signal CK(p) to generate a synchronization flag signal FLAG(p). The source of the flag signal TXFLAG(p) may be a reset signal or a start signal. Moreover, the pre-stage circuit 210 combines the synchronization flag signal FLAG(p) into each of the middle signals MS0 to MS3 and transmits the combined signals to the post-stage circuit 220.

It is noted that the flip-flop sets 211 to 214 may each include a plurality of flip-flops, and the number of the flip-flops in each of the flip-flop sets 211 to 214 may match the number of bits of each of the data signals DT0 to DT3.

The post-stage circuit 220 includes a plurality of analog transmission channels ALANE[0] to ALANE[3] respectively corresponding to the digital transmission channels LANE[0] to LANE[3]. The analog transmission channels ALANE[0] to ALANE[3] respectively include flip-flop sets 221 to 224, serial flag signal synchronization circuits SYNC2 to SYNC5, parallel-serial signal conversion circuits 250 to 253, and output-stage flip-flops 225 to 228.

The flip-flop sets 221 to 224 are respectively correspondingly coupled to the flip-flop sets 211 to 214 and the parallel flag signal synchronization circuit SYNC1(p) and are respectively configured to receive the middle signals MS0 to MS3 and the synchronization flag signal FLAG(p). The flip-flop sets 221 to 224 are configured to transmit the middle signals MS0 to MS3 and the synchronization flag signal FLAG(p) to the serial flag signal synchronization circuits SYNC2 to SYNC5 and the parallel-serial signal conversion circuits 250 to 253 of the post-stage circuit 220 according to the base clock signal CK(p). In the description above, the number of flip-flops in each of the flip-flop sets 221 to 224 is substantially larger than the number of flip-flops in each of the flip-flop sets 211 to 214. It is noted that suitable transmission delay circuits DE4 to DE7 may be respectively disposed at the clock terminals of the flip-flop sets 221 to 224 to adjust the time points at which the flip-flop sets 221 to 224 are triggered to be substantially identical.

In the embodiment, the flip-flop sets 221 to 224 respectively correspondingly generate first data signals DP0 to DP3 and flags DP_FLAG0 to DP FLAGS. Each of the first data signals DP0 to DP3 is a parallel signal having a plurality of bits. The first data signals DP0 to DP3 are respectively transmitted to the parallel-serial signal conversion circuits 250 to 253, and the flags DP_FLAG0 to DP_FLAG3 are respectively transmitted to the serial flag signal synchronization circuits SYNC2 to SYNC5. The serial flag signal synchronization circuits SYNC2 to SYNC5 respectively perform synchronization for the flags DP_FLAG0 to DP_FLAG3 according to the second clock signal CK(s) and respectively generate a plurality of synchronization flag signals FLAG(s). It is noted here that suitable transmission delay circuits DEA8 to DEA10 may be disposed (or not disposed) in the path the serial flag signal synchronization circuits SYNC2 to SYNC5 receive the second clock signal CK(s), so that the time points at which the serial flag signal synchronization circuits SYNC2 to SYNC5 are triggered can be substantially identical. In the embodiment, the lengths of time delays provided by the transmission delay circuits DEA8 to DAE10 may be all identical, all different, or partially identical and may be set by the designer according to the layout, the manufacturing parameters, and the operation status of the circuit, which is not specifically limited herein.

Further to the description above, the parallel-serial signal conversion circuits 250 to 253 respectively receive the first data signals DP0 to DP3, the synchronization flag signals FLAG(s), and the second clock signal CK(s). The parallel-serial signal conversion circuits 250 to 253 respectively set the starting time point of the conversion operation according to the received synchronization flag signals FLAG(s) and respectively sequentially transmit the bits of the first data signals DP0 to DP3 according to the second clock signal CK(s) to respectively generate second data signals DS0 to DS3. Specifically, the second data signals DS0 to DS3 are serial signals.

The second data signals DS0 to DS3 are respectively transmitted to the output-stage flip-flops 225 to 228. The output-stage flip-flops 225 to 228 respectively transmit the second data signals DS0 to DS3 according to the second clock signal CK(s) to generate output signals TXPN0 to TXPN3. It is noted that suitable transmission delay circuits (e.g., transmission delay circuits DE11 to DE13) may be disposed (or not disposed) in the path the clock terminals of the output-stage flip-flops 225 to 228 receive the second clock signal CK(s) to adjust the time points at which the output-stage flip-flops 225 to 228 are triggered to be substantially identical.

On the other hand, the clock signal generator 230 may be constructed by one or more frequency dividers. The clock signal generator 230 may provide a plurality of divisors to perform frequency division for the second clock signal CK(s) and generate the multi-channel clock CKx(p) including a plurality of first clock signals PMAD_CK0 to PMAD_CKN having the same frequency and different phases. The hardware framework of the frequency divider may be implemented according to the frequency divider framework familiar to people of ordinary skill in the art and is not specifically limited herein.

It is noted that, in the embodiment, the pre-stage circuit 210 does not transmit the synchronization flag signal FLAG(p) to the post-stage circuit 220 simply through a transmission line, but uses the flip-flop sets 221 to 224 to transmit the synchronization flag signal FLAG(p) to the post-stage circuit 220 according to the base clock signal CK(p). Accordingly, the time delays of the flags DP_FLAG0 to DP_FLAG3 obtained by the post-stage circuit 220 can be well controlled, and possible data skew can be reduced.

Figure 3:
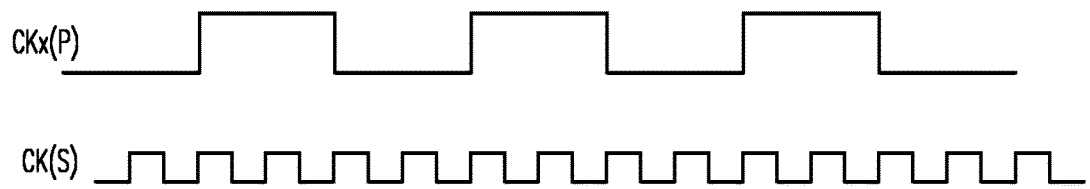
FIG. 3 illustrates a waveform diagram of a clock signal.

Referring to FIG. 3, FIG. 3 illustrates a waveform diagram of a clock signal. The clock signal generator 230 receives the second clock signal CK(s) having a relatively high frequency and generates the multi-channel clock CKx(p) having a relatively low frequency through frequency division. In the embodiment, the frequency of the second clock signal CK(s) may be two times of the frequency of the multi-channel clock CKx(p). Of course, in other embodiments of the disclosure, the frequency of the second clock signal CK(s) may be A times of the frequency of the multi-channel clock CKx(p), and A is any real number larger than 1.

Moreover, the second clock signal CK(s) may be generated by a phase-locked loop circuit. Specifically, the phase-locked loop circuit may receive a source clock signal and perform a frequency multiplication operation for the source clock signal to generate the second clock signal CK(s). Here, the embodiment may be implemented with a phase-locked loop circuit familiar to people of ordinary skill in the art and is not specifically limited herein.

Referring back to FIG. 2, it is also noted that the transmission delay circuit in the embodiments above may be implemented by one or more serially connected buffers or inverters, or any other semiconductor devices that can provide time delay and is not specifically limited herein. Moreover, the parallel flag signal synchronization circuit SYNC1 may be constructed by a flip-flop in a digital form, and the serial flag signal synchronization circuits SYNC2 to SYNC4 may be constructed by flip-flops in an analog form.

According to the descriptions above, in the embodiment, under the influence of temperature, voltage, and manufacturing process drift, the pre-stage circuit 210 can cause the data skew generated therein to be no more than 500 picoseconds through a method of static timing analysis. It is noted that with the post-stage circuit 220 performing data transmission based on the second clock signal CK(s), the data skew that is likely to occur in the post-stage circuit 220 may be no more than two times of the UI (unit interval), wherein the UI is equal to the cycle of the second clock signal CK(s).

Figure 4:
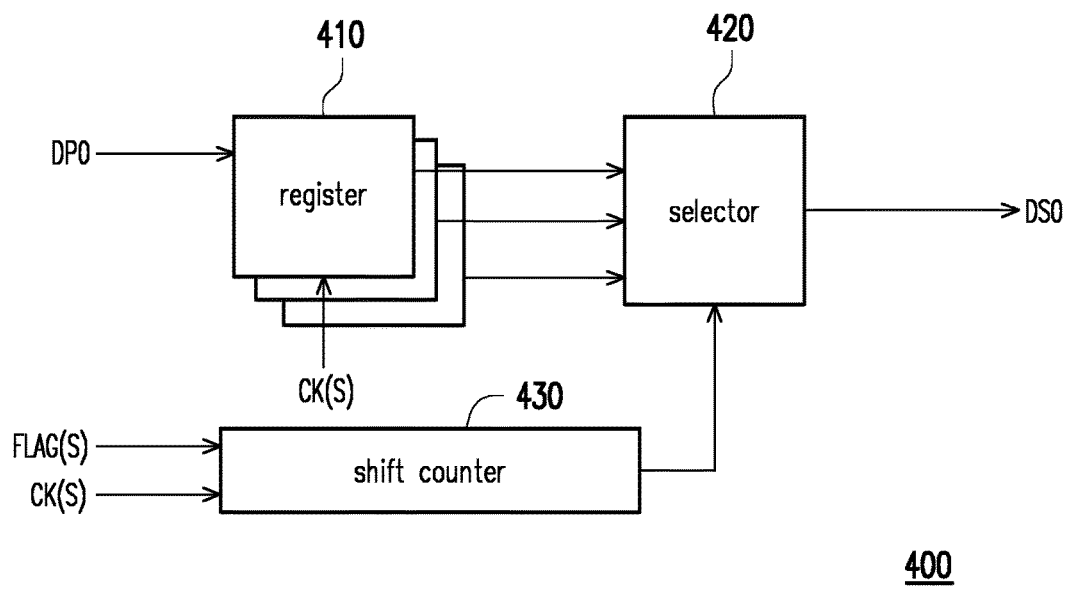
FIG. 4 is a schematic diagram illustrating an implementation of a parallel-serial signal conversion circuit of an embodiment of the disclosure.

Next, referring to FIG. 4, FIG. 4 is a schematic diagram illustrating an implementation of a parallel-serial signal conversion circuit of an embodiment of the disclosure. A parallel-serial signal conversion circuit 400 includes a plurality of registers 410, a selector 420, and a shift counter 430. The registers 410 respectively receive a plurality of bits of a first data signal DP0. The output terminals of the registers 410 are coupled to the selector 420. The shift counter 430 receives a synchronization flag FLAG(s) and a second clock signal CK(s). The shift counter 430 starts a counting operation according to the synchronization flag FLAG(s) and performs the counting operation according to the second clock signal CK(s) to generate a counting result. The selector 420 sequentially selects the stored data of one of the registers 410 according to the counting result of the shift counter 430 to perform, output and thereby generate a second data signal DS0.

Next, referring to FIG. 5, FIG. 5 is a schematic diagram illustrating an integrated circuit according to an embodiment of the disclosure. An integrated circuit 500 includes a core circuit 501 and a multi-channel transmission apparatus 510. The multi-channel transmission apparatus 510 is coupled to the core circuit 501 and is configured to transmit the data signal generated in the core circuit 501. The multi-channel transmission apparatus 510 includes a clock signal generator 513, pre-stage circuits 511, 521, and post-stage circuits 512, 522. The pre-stage circuit 511 is coupled to the post-stage circuit 512, and the pre-stage circuit 521 is coupled to the post-stage circuit 522. Specifically, the numbers of the pre-stage circuits and the post-stage circuits that may be disposed in the integrated circuit 500 may be one or more and are not specifically limited herein.

Implementation details of the clock signal generator 513, the pre-stage circuits 511, 521, and the post-stage circuits 512, 522 have been elaborated in the foregoing embodiments and are thus not repeatedly described here.

Referring to FIG. 6, FIG. 6 is a flowchart illustrating a multi-channel signal transmission method according to an embodiment of the disclosure. In step S610, a pre-stage circuit is provided to receive a plurality of first clock signals and a plurality of data signals, select one of the first clock signals to be a base clock signal, and transmit the data signals according to the base clock signal to respectively generate a plurality of middle signals. In step S620, a clock signal generator is provided to generate the first clock signals according to a second clock signal, wherein a frequency of the second clock signal is higher than a frequency of the first clock signals. In step S630, a post-stage circuit is provided to transmit the middle signals according to the second clock signal to respectively generate a plurality of output signals. In step S640, the pre-stage circuit is provided to receive a flag signal and synchronize the flag signal according to the base clock signal to generate a first synchronization flag signal. Specifically, the pre-stage circuit combines the first synchronization flag signal into each of the middle signals and transmits them to the post-stage circuit. In the embodiment, the pre-stage circuit is a digital circuit, and the post-stage circuit is an analog circuit.

Implementation details of the steps above have been elaborated in the foregoing embodiments and examples and are thus not repeatedly described here.

In summary of the above, in the multi-channel transmission apparatus of the disclosure, the post-stage circuit in the form of an analog circuit performs the data signal transmission operations according to the second clock signal having a relatively high frequency in an internally consistent manner, which effectively reduces the degree of data skew that is likely to occur. Moreover, in the case where the metastable state occurs, the degree of data skew can also be effectively reduced.

Although the disclosure is disclosed as the embodiments above, the embodiments are not meant to limit the disclosure. Any person skilled in the art may make slight modifications and variations without departing from the spirit and scope of the disclosure. Therefore, the protection scope of the disclosure shall be defined by the claims attached below.

What is claimed is:

1. A multi-channel transmission apparatus comprising:
   a pre-stage circuit, receiving a plurality of first clock signals and a plurality of data signals, selecting one of the first clock signals to be a base clock signal, and transmitting the data signals according to the base clock signal to respectively generate a plurality of middle signals;
   a clock signal generator, receiving a second clock signal and generating the first clock signals according to the second clock signal, wherein a frequency of the second clock signal is higher than a frequency of the first clock signals; and
   a post-stage circuit, coupled to the pre-stage circuit and the clock signal generator, transmitting the middle signals according to the second clock signal to respectively generate a plurality of output signals,
   wherein the pre-stage circuit comprises:
      a parallel flag signal synchronization circuit, receiving a flag signal and synchronizing the flag signal according to the base clock signal to generate a first synchronization flag signal, wherein the pre-stage circuit combines the first synchronization flag signal into each of the middle signals and transmits them to the post-stage circuit,
   wherein the pre-stage circuit is a digital circuit, and the post-stage circuit is an analog circuit.

2. The multi-channel transmission apparatus according to claim 1, wherein the pre-stage circuit further comprises:
   a plurality of digital transmission channels, respectively receiving the data signals and transmitting the data signals according to the base clock signal to respectively generate the middle signals,
   wherein each of the data signals and the middle signals is a parallel signal having multiple bits.

3. The multi-channel transmission apparatus according to claim 1, wherein the post-stage circuit comprises:
   a plurality of analog transmission channels, respectively receiving the middle signals and transmitting the middle signals according to the second clock signal to generate the output signals, wherein each of the output signals is a serial signal generated according to the second clock signal.

4. The multi-channel transmission apparatus according to claim 3, wherein each of the analog transmission channels comprises:
   a flip-flop set, receiving the middle signals and the first synchronization flag signal and generating a plurality of first data signals and a flag according to the base clock signal;
   a serial flag signal synchronization circuit, synchronizing the first synchronization flag signal according to the second clock signal to generate a second synchronization flag signal;
   a parallel-serial signal conversion circuit, sequentially transmitting the first data signals according to the second clock signal based on the second synchronization flag signal to generate a second data signal, wherein the second data signal is a serial signal; and
   an output-stage flip-flop, synchronizing the second data signal according to the second clock signal and generating the corresponding output signal.

5. The multi-channel transmission apparatus according to claim 4, wherein time points at which the serial flag signal synchronization circuits corresponding to the analog transmission channels are triggered are identical.

6. The multi-channel transmission apparatus according to claim 4, wherein each of the analog transmission channels further comprises:
   a transmission delay circuit, serially connected in a path the serial flag signal synchronization circuit receives the second clock signal to adjust a time point at which the serial flag signal synchronization circuit is triggered.

7. The multi-channel transmission apparatus according to claim 4, wherein the parallel-serial signal conversion circuit comprises:
   a plurality of registers, respectively receiving and temporarily storing the first data signals;
   a shift counter, starting a counting operation according to the second synchronization flag signal and performing the counting operation according to the second clock signal to generate a counting result; and
   a selector, coupled to the registers, sequentially selecting one of the first data signals respectively stored in the registers according to the counting result to perform output and thereby generating the second data signal.

8. The multi-channel transmission apparatus according to claim 4, wherein each of the analog transmission channels further comprises:
a transmission delay circuit, serially connected in a path the output-stage flip-flop set receives the second clock signal to adjust a time point at which the output-stage flip-flop set is triggered.

9. The multi-channel transmission apparatus according to claim 4, wherein time points at which the output-stage flip-flop sets corresponding to the analog transmission channels are triggered are identical.

10. The multi-channel transmission apparatus according to claim 1, further comprising:
a phase-locked loop circuit, generating the second clock signal according to a source clock signal.

11. An integrated circuit comprising:
a multi-channel transmission apparatus comprising:
at least one pre-stage circuit, receiving a plurality of first clock signals and a plurality of data signals, selecting one of the first clock signals to be a base clock signal, and transmitting the data signals according to the base clock signal to respectively generate a plurality of middle signals;
a clock signal generator, receiving a second clock signal and generating the first clock signals according to the second clock signal, wherein a frequency of the second clock signal is higher than a frequency of the first clock signals; and
at least one post-stage circuit, coupled to the at least one pre-stage circuit and the clock signal generator, transmitting the middle signals according to the second clock signal to respectively generate a plurality of output signals,
wherein the at least one pre-stage circuit comprises:
a parallel flag signal synchronization circuit, receiving a flag signal and synchronizing the flag signal according to the base clock signal to generate a first synchronization flag signal, wherein the pre-stage circuit combines the first synchronization flag signal into each of the middle signals and transmits them to the at least one post-stage circuit,
wherein the at least one pre-stage circuit is a digital circuit, and the at least one post-stage circuit is an analog circuit.

12. The integrated circuit according to claim 11, wherein the at least one pre-stage circuit further comprises:
a plurality of digital transmission channels, respectively receiving the data signals and transmitting the data signals according to the base clock signal to respectively generate the middle signals,
wherein each of the data signals and the middle signals is a parallel signal having multiple bits.

13. The integrated circuit according to claim 11, wherein the at least one post-stage circuit comprises:
a plurality of analog transmission channels, respectively receiving the middle signals and transmitting the middle signals according to the second clock signal to generate the output signals, wherein each of the output signals is a serial signal generated according to the second clock signal.

14. The integrated circuit according to claim 13, wherein each of the analog transmission channels comprises:

a flip-flop set, receiving the middle signals and the first synchronization flag signal and generating a plurality of first data signals and a flag according to the base clock signal;
a serial flag signal synchronization circuit, synchronizing the first synchronization flag signal according to the second clock signal to generate a second synchronization flag signal;
a parallel-serial signal conversion circuit, sequentially transmitting the first data signals according to the second clock signal based on the second synchronization flag signal to generate a second data signal, wherein the second data signal is a serial signal; and
an output-stage flip-flop, synchronizing the second data signal according to the second clock signal and generating the corresponding output signal.

15. The integrated circuit according to claim 14, wherein time points at which the serial flag signal synchronization circuits corresponding to the analog transmission channels are triggered are identical.

16. The integrated circuit according to claim 14, wherein each of the analog transmission channels further comprises:
a transmission delay circuit, serially connected in a path the serial flag signal synchronization circuit receives the second clock signal to adjust a time point at which the serial flag signal synchronization circuit is triggered.

17. The integrated circuit according to claim 14, wherein the parallel-serial signal conversion circuit comprises:
a plurality of registers, respectively receiving and temporarily storing the first data signals;
a shift counter, starting a counting operation according to the second synchronization flag signal and performing the counting operation according to the second clock signal to generate a counting result; and
a selector, coupled to the registers, sequentially selecting one of the first data signals respectively stored in the registers according to the counting result to perform output and thereby generating the second data signal.

18. The integrated circuit according to claim 14, wherein each of the analog transmission channels further comprises:
a transmission delay circuit, serially connected in a path the output-stage flip-flop set receives the second clock signal to adjust a time point at which the output-stage flip-flop set is triggered.

19. The integrated circuit according to claim 14, wherein time points at which the output-stage flip-flop sets corresponding to the analog transmission channels are triggered are identical.

20. The integrated circuit according to claim 11, wherein the multi-channel transmission apparatus further comprises:
a phase-locked loop circuit, generating the second clock signal according to a source clock signal.

21. A multi-channel signal transmission method comprising:
providing a pre-stage circuit to receive a plurality of first clock signals and a plurality of data signals, select one of the first clock signals to be a base clock signal, and transmit the data signals according to the base clock signal to respectively generate a plurality of middle signals;
providing a clock signal generator to generate the first clock signals according to a second clock signal, wherein a frequency of the second clock signal is higher than a frequency of the first clock signals;

providing a post-stage circuit to transmit the middle signals according to the second clock signal to respectively generate a plurality of output signals; and having the pre-stage circuit receive a flag signal and synchronize the flag signal according to the base clock signal to generate a first synchronization flag signal, wherein the pre-stage circuit combines the first synchronization flag signal into each of the middle signals and transmits them to the post-stage circuit, wherein the pre-stage circuit is a digital circuit, and the post-stage circuit is an analog circuit.

* * * * *